United States Patent
Ikeda et al.

(10) Patent No.: US 12,494,449 B2
(45) Date of Patent: Dec. 9, 2025

(54) SEMICONDUCTOR DEVICE WITH ANTENNA

(71) Applicant: Fujitsu Limited, Kawasaki (JP)

(72) Inventors: Junya Ikeda, Atsugi (JP); Yoshihiro Nakata, Atsugi (JP); Shinya Sasaki, Ebina (JP)

(73) Assignee: Fujitsu Limited, Kawasaki (JP)

( * ) Notice: Subject to any disclaimer, the term of this patent is extended or adjusted under 35 U.S.C. 154(b) by 385 days.

(21) Appl. No.: 18/332,220

(22) Filed: Jun. 9, 2023

(65) Prior Publication Data

US 2024/0088083 A1 Mar. 14, 2024

(30) Foreign Application Priority Data

Sep. 13, 2022 (JP) .................. 2022-145101

(51) Int. Cl.
*H01Q 1/02* (2006.01)
*H01L 21/56* (2006.01)
(Continued)

(52) U.S. Cl.
CPC .............. *H01L 24/20* (2013.01); *H01L 21/56* (2013.01); *H01L 23/3128* (2013.01);
(Continued)

(58) Field of Classification Search
CPC ........... H01Q 1/02; H01Q 1/50; H01Q 1/526; H01Q 1/2283; H01Q 9/0407; H01Q 9/0414; H01Q 21/0006; H01Q 21/0025; H01Q 21/065; H01Q 23/00; H01L 24/20; H05K 1/0204

See application file for complete search history.

(56) References Cited

U.S. PATENT DOCUMENTS 10,594,019 B2 * 3/2020 Baks ................. H01Q 9/045
10,950,556 B2 * 3/2021 Wu .................. H01L 21/32051
(Continued)

FOREIGN PATENT DOCUMENTS

| JP | 2010-251427 A | 11/2010 |
| JP | 2012-222331 A | 11/2012 |
| JP | 2021-125624 A | 8/2021 |

OTHER PUBLICATIONS

Extended European Search Report mailed on Feb. 1, 2024 for the corresponding European Patent Application No. 23178537.9.

*Primary Examiner* — Tung X Le
(74) *Attorney, Agent, or Firm* — ArentFox Schiff LLP

(57) ABSTRACT

A semiconductor device with an antenna includes a heat sink having first and second surfaces, a semiconductor chip provided on the second surface and having a circuit surface, a wiring board having a laminate of alternately disposed insulating layers and interconnect layers, and covering side surfaces of the heat sink and the semiconductor chip and the circuit surface, and exposing the first surface, and an antenna provided on the wiring board. The wiring board includes a board connecting part provided on an opposite side from the antenna, a first interconnect electrically connecting the board connecting part and a first terminal provided on the circuit surface, and a second interconnect electrically connecting the antenna and a second terminal provided on the circuit surface.

12 Claims, 10 Drawing Sheets

(51) Int. Cl.
*H01L 23/00* (2006.01)
*H01L 23/31* (2006.01)
*H01L 23/66* (2006.01)
*H01Q 1/22* (2006.01)
*H05K 1/02* (2006.01)
*H01L 23/29* (2006.01)

(52) U.S. Cl.
CPC .............. *H01L 23/66* (2013.01); *H01L 24/19* (2013.01); *H01Q 1/2283* (2013.01); *H05K 1/0204* (2013.01); *H01L 23/295* (2013.01); *H01L 23/296* (2013.01); *H01L 2223/6672* (2013.01); *H01L 2223/6677* (2013.01); *H01L 2224/19* (2013.01); *H01L 2224/211* (2013.01); *H01L 2224/215* (2013.01); *H01L 2924/01029* (2013.01); *H01L 2924/14215* (2013.01)

(56) References Cited

U.S. PATENT DOCUMENTS

| | | | |
|---|---|---|---|
| 11,309,621 B2* | 4/2022 | Baek | H01Q 1/526 |
| 12,119,541 B2* | 10/2024 | Li | H01L 23/49838 |
| 12,212,064 B2* | 1/2025 | Rahman | H01Q 1/02 |
| 12,249,767 B2* | 3/2025 | Kim | H01Q 1/48 |
| 2014/0145884 A1* | 5/2014 | Dang | H01Q 1/38 |
| | | | 343/700 MS |
| 2016/0049723 A1* | 2/2016 | Baks | H01Q 9/0457 |
| | | | 343/848 |
| 2019/0057924 A1 | 2/2019 | Kim et al. | |
| 2022/0037270 A1 | 2/2022 | Wei et al. | |
| 2022/0209391 A1 | 6/2022 | Tang et al. | |

* cited by examiner

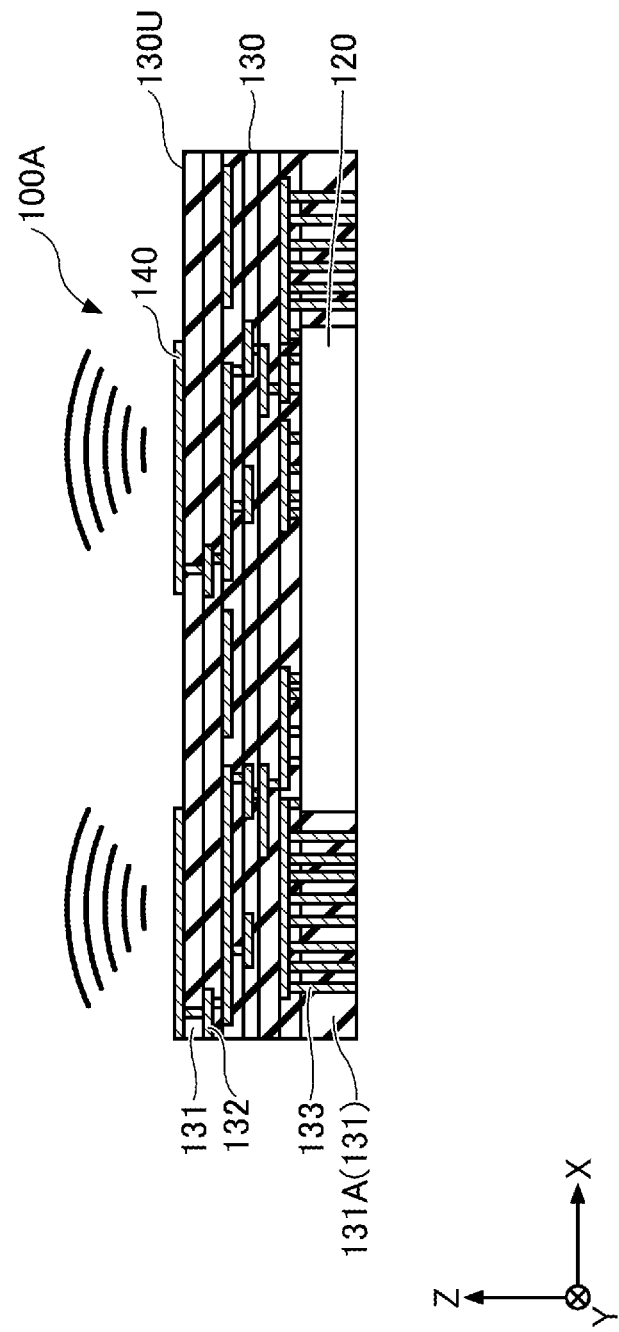

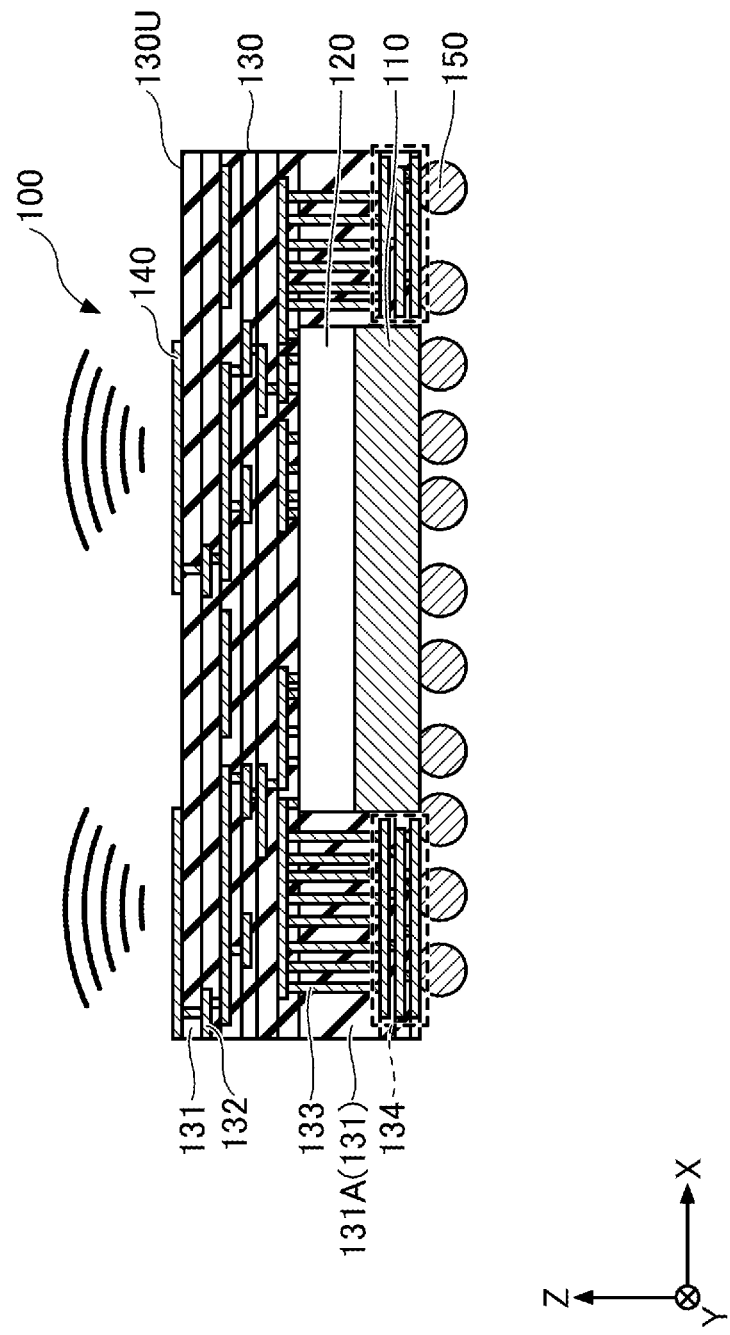

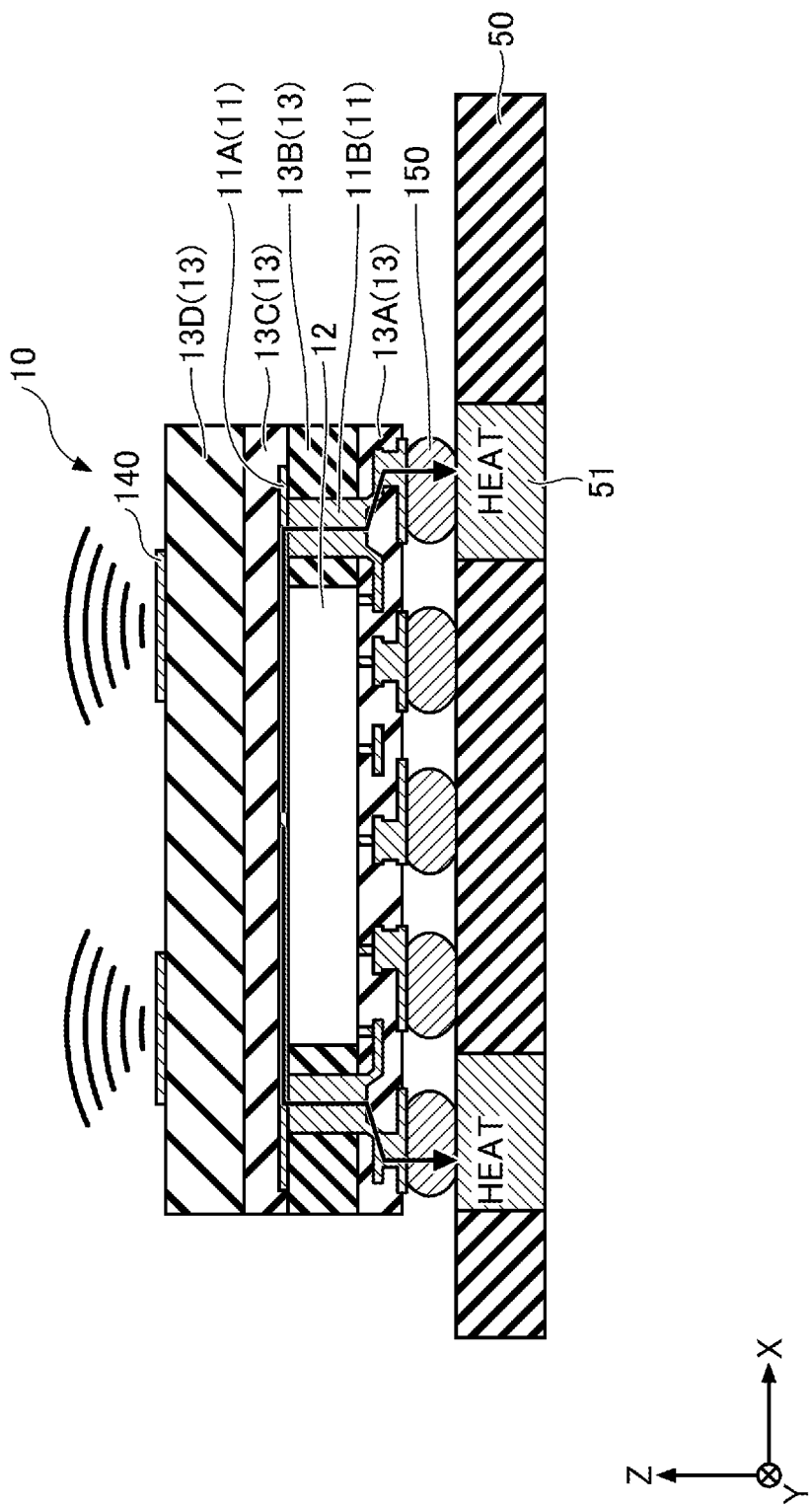

SEMICONDUCTOR DEVICE WITH ANTENNA

CROSS-REFERENCE TO RELATED APPLICATIONS

This application is based upon and claims the benefit of priority of the prior Japanese Patent Application No. 2022-145101, filed on Sep. 13, 2022, the entire contents of which are incorporated herein by reference.

FIELD

The embodiments discussed herein are related to semiconductor devices with antennas.

BACKGROUND

An example of a semiconductor package proposed in Japanese Laid-Open Patent Publication No. 2012-222331, for example, includes a heat spreader directly mounted thereon with a semiconductor device, a multilayer ceramic substrate, a metal block, and a plurality of solder balls. The multilayer ceramic substrate makes contact with a peripheral side surface of the heat spreader, to maintain airtightness of the semiconductor device. The metal block supports the heat spreader from below, and makes contact with the peripheral side surface of the multilayer ceramic substrate. The metal block has a linear expansion coefficient that is approximately the same as a linear expansion coefficient of the multilayer ceramic substrate. The plurality of solder balls is bonded to lower surfaces of the multilayer ceramic substrate and the metal block.

However, because the proposed semiconductor package uses the multilayer ceramic substrate, it is difficult to manufacture micro interconnects or the like capable of coping with the millimeter band or extremely high frequency (EHF), for example.

SUMMARY

Accordingly, it is an object in one aspect of the embodiments to provide a semiconductor device with an antenna, that can be reduced in size.

According to one aspect of the embodiments, a semiconductor device with an antenna includes a heat sink having a first surface, and a second surface located on an opposite side from the first surface; a semiconductor chip provided on the second surface of the heat sink, and having a circuit surface located on an opposite side from a surface thereof directly opposing the second surface of the heat sink; a wiring board having a first board surface located at a position closer to the first surface than to the second surface of the heat sink, a second board surface located on an opposite side from the first board surface, and a laminate of alternately disposed insulating layers and interconnect layers, wherein the wiring board covers a side surface of the heat sink, and a side surface and the circuit surface of the semiconductor chip, and exposes the first surface of the heat sink at the first board surface; and an antenna provided on the second board surface of the wiring board, wherein the wiring board further includes a board connecting part provided on the first board surface, a first interconnect configured to electrically connect the board connecting part and a first terminal provided on the circuit surface of the semiconductor chip, and a second interconnect configured to electrically connect the antenna and a second terminal provided on the circuit surface of the semiconductor chip.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5A is a diagram for explaining a manufacturing process of the semiconductor device with the antenna;

FIG. 5B is a diagram for explaining a manufacturing process of the semiconductor device with the antenna;

FIG. 6 is a diagram illustrating an example of a configuration of a semiconductor device with an antenna according to a comparative example;

DESCRIPTION OF EMBODIMENTS

Figure 1:
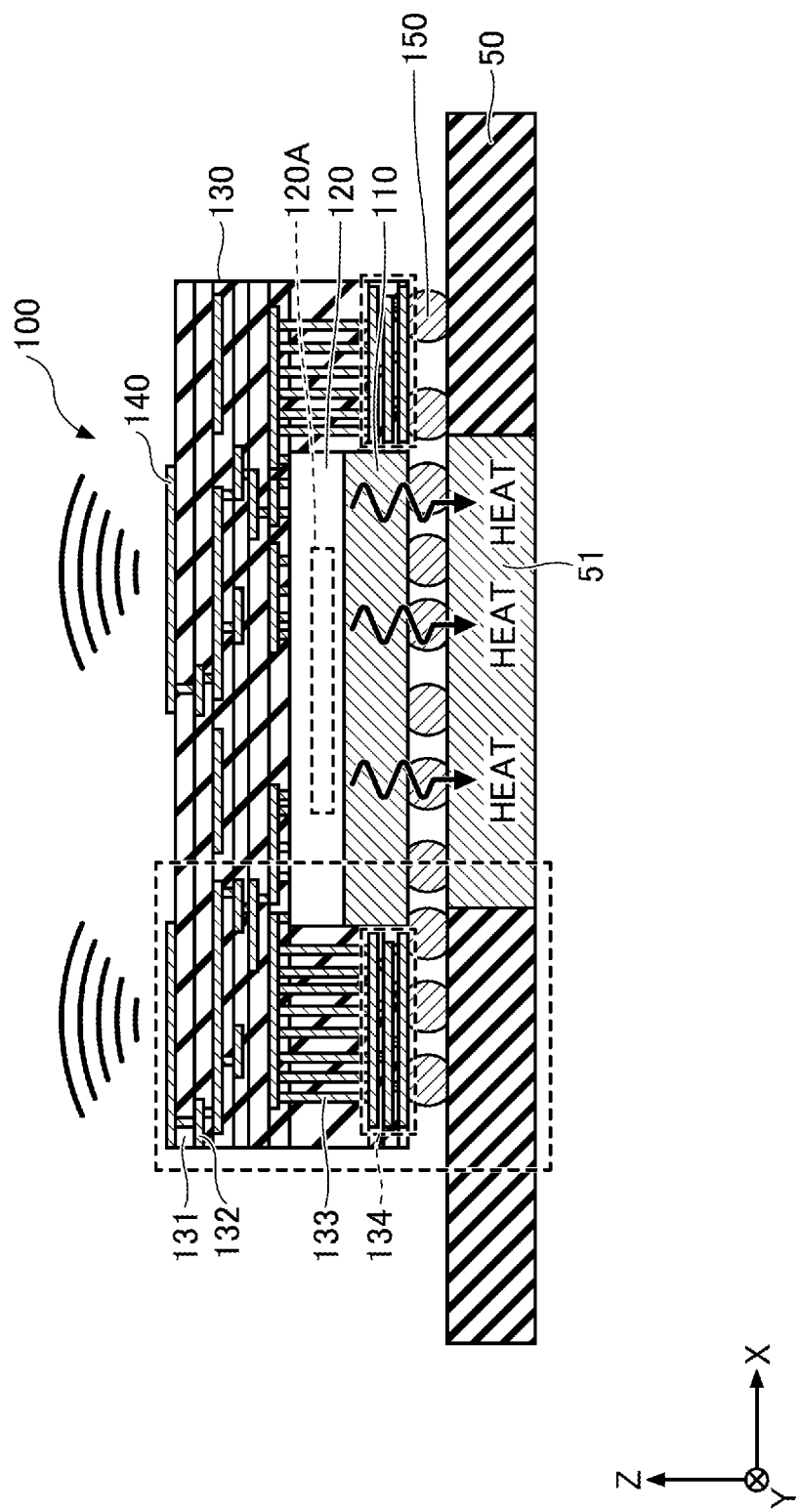
FIG. 1 is a diagram illustrating an example of a cross sectional configuration of a semiconductor device with an antenna according to one embodiment.

Preferred embodiments of a semiconductor device with an antenna according to the present disclosure will be described with reference to the accompanying drawings.

In the following description, the same constituent elements are designated by the same reference numerals, and a redundant description of the same constituent elements may be omitted.

An XYZ coordinate system, defined as follows, is used in the following description. A direction parallel to an X-axis (X-direction), a direction parallel to a Y-axis (Y-direction), and a direction parallel to a Z-axis (Z-direction), are orthogonal to one an other. The X-direction is an example of a first axial direction, the Y-direction is an example of a second axial direction, and the Z-direction is an example of a third axial direction. For the sake of convenience in the following description, the −Z-direction side may be referred to as a lower side or below, and the +Z-direction side may be referred to as an upper side or above. In addition, a plan view of each part refers to a view of each part viewed in a direction perpendicular to the XY-plane. In the following description, lengths, widths, thicknesses, or the like of each part in the drawings may be exaggerated to facilitate the understanding of the configuration. Further, the terms "parallel", "perpendicular", "orthogonal", "horizontal", "vertical", "up-down", or the like may tolerate deviations to an extent that does not impair the effects of the embodiments and modifications thereof.

Moreover, in the following description, "millimeter wave" or "millimeter band" or "extremely high frequency (EHF)" may include a near-millimeter wave in a frequency range of 24 GHz to 30 GHz, in addition to a frequency range of 30 GHz to 300 GHz.

It is assumed in the following description that radio waves transmitted from or received by the antenna of the semiconductor device with the antenna according to one embodiment, are radio waves in the millimeter band of the sixth generation (6G) mobile communication system or the like, in the frequency range of 40 GHz or higher, for example. However, the radio waves transmitted from or received by the antenna may be radio waves in the millimeter band of the Sub-6, the fifth generation (5G) mobile communication system, or the like, in the frequency range of 1 GHz to 30 GHz.

EMBODIMENT

Figure 2:
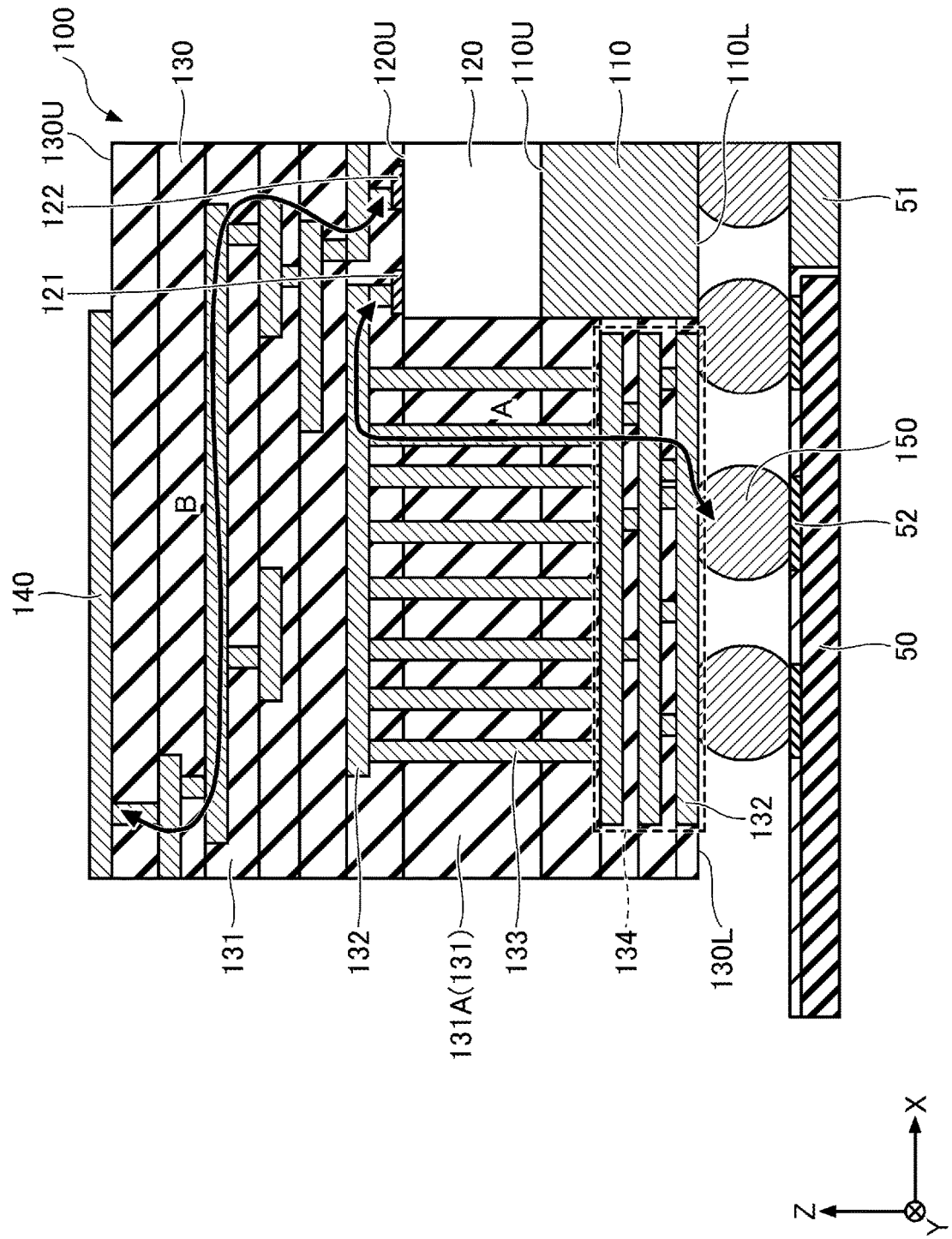
FIG. 2 is diagram on an enlarged scale illustrating a portion surrounded by a broken line rectangle in FIG. 1.
Figure 3:
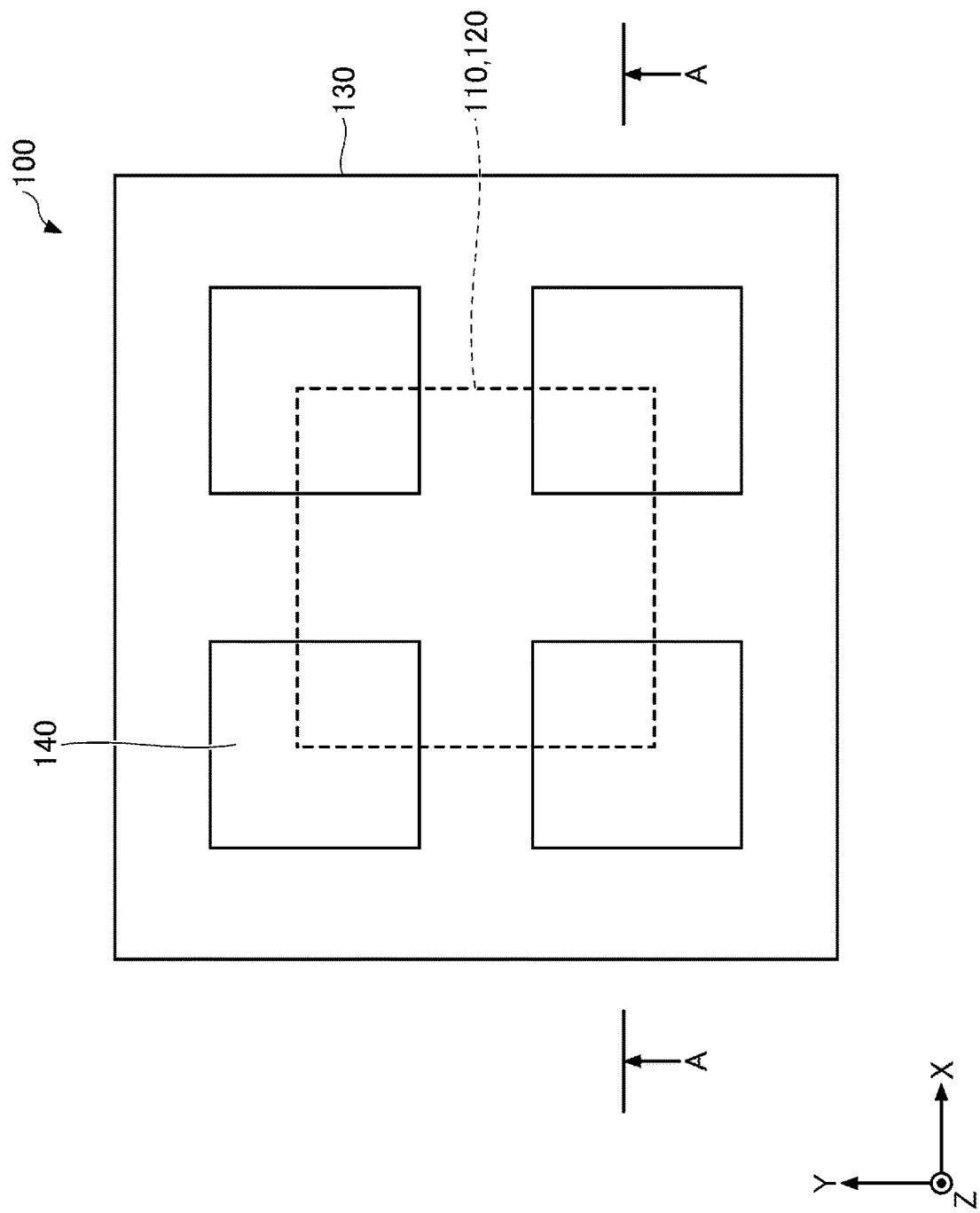
FIG. 3 is a diagram illustrating an example of a planar configuration of an upper surface side of the semiconductor device with the antenna.
Figure 4:
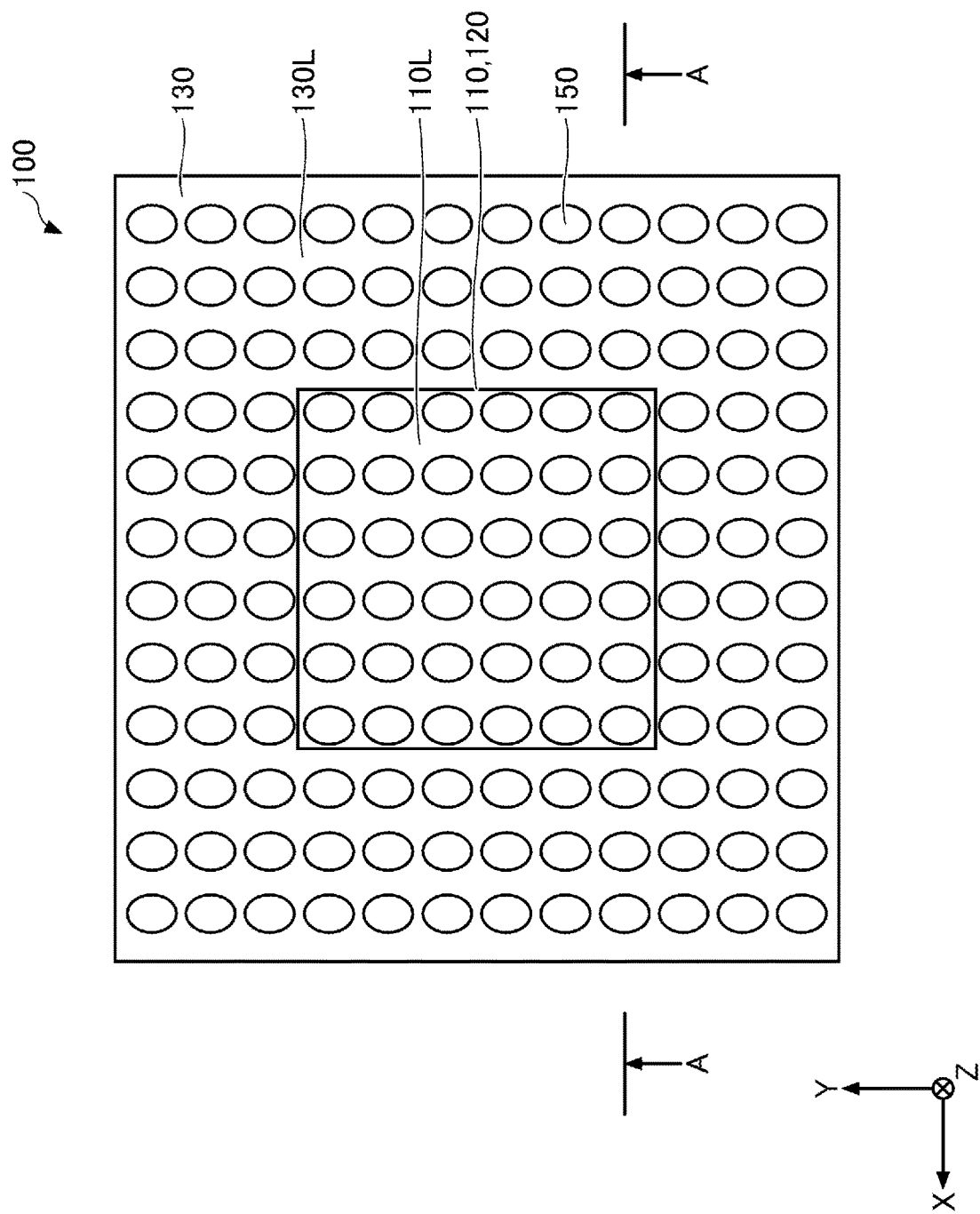
FIG. 4 is a diagram illustrating an example of the planar configuration of a lower surface side of the semiconductor device with the antenna.

FIG. 1 is a diagram illustrating an example of a cross sectional configuration of a semiconductor device 100 with an antenna 140 (hereinafter also simply referred to as the "semiconductor device 100") according to one embodiment. FIG. 2 is a diagram on an enlarged scale illustrating a portion surrounded by a broken line rectangle in FIG. 1. FIG. 3 is a diagram illustrating an example of a planar configuration of an upper surface side of the semiconductor device 100. FIG. 4 is a diagram illustrating an example of the planar configuration of a lower surface side of the semiconductor device 100. The cross section illustrated in FIG. 1 is taken along a line A-A in each of FIG. 3 and FIG. 4.

The semiconductor device 100 includes a heat sink 110, a semiconductor chip 120, a wiring board 130, the antenna 140, and a plurality of ball grid arrays (BGAs) 150 having a plurality of solder balls arranged in an array, respectively. The semiconductor device 100 is mounted on a radio frequency (RF) board 50 via the BGAs 150. The BGAs 150 are an example of connection terminals of one type.

The semiconductor device 100 may be a semiconductor package, often referred to as an antenna in package (AiP), including the antenna 140 as an RF antenna inside the package. As an example, the semiconductor device 100 may be a wireless communication device that can be mounted on a radio unit (RU) of a front end of a base station, and the RF board 50 may be a mother board of the base station.

The AiP is configured to amplify a signal by the semiconductor chip 120 provided therein, and radiate radio waves from the antenna 140 provided therein. In recent applications for the 5G and the beyond-5G mobile communication systems or the like, the millimeter band or the extremely high frequency is actively utilized, in order to cope with ultra high-speed communication, ultra-low latency communication (ULLC), and massive machine type communication (mMTC). In order to achieve a high output or power in the AiP for the base station, an RF chip including a heat generating part, such as a power amplifier or the like, is required to be arranged in a vicinity of the antenna 140, so that radio waves with a low loss and a high output or power can be radiated from the antenna 140. In order to meet such a requirement, the semiconductor device 100 according to this embodiment enables the heat of the semiconductor chip 120 to be efficiently dissipated to the outside.

The RF board 50 includes a heat sink 51, and terminals 52. The heat sink 51 is provided in the RF board 50, and is connected to a heat sink 110 of the semiconductor device 100 via the BGA 150. The heat sink 51 is provided to dissipate the heat transferred from the heat sink 110 through the BGA 150, to the outside of the RF board 50. The heat sink 51 is preferably formed of a metal having a high thermal conductivity, and examples of the metal having the high thermal conductivity include metals, such as aluminum, copper, or the like.

The terminals 52 are provided on an upper surface of the RF board 50, and are electrically connected to interconnects A of the wiring board 130 via the BGA 150. The interconnects A are electrically connected to terminals 121 on a circuit surface 120U, that is, an upper surface of the semiconductor chip 120. The interconnects A are an example of a first interconnect. The terminals 121 are electrically connected to a circuit inside the semiconductor chip 120.

The heat sink 110 may be a plate shaped heat spreader having a lower surface 110L and an upper surface 110U. The lower surface 110L is an example of a first surface, and the upper surface 110U is an example of a second surface. The heat sink 110 is preferably formed of a metal having a high thermal conductivity, and examples of the metal having the high thermal conductivity include aluminum, copper, or the like. The heat sink 110 is located at a position below (that is, on the lower side of) the semiconductor chip 120, and for example, the upper surface 110U of the heat sink 110 makes contact with a lower surface of the semiconductor chip 120.

A side surface of the heat sink 110 is covered with the wiring board 130, and the lower surface 110L of the heat sink 110 is exposed at a lower surface 130L of the wiring board 130, as illustrated in FIG. 4. As an example, the heat sink 110 may be located at a height position identical to a height position of a matching circuit 134 that is located at the lowermost portion of the wiring board 130 along a height direction (or Z-direction). In other words, the lower surface 110L of the heat sink 110 may coincide with lower surfaces of an interconnect layer and vias forming the matching circuit 134. As an example, the heat sink 110 may be formed of a metal material that is identical to the metal material used for the interconnect layer and the vias of the matching circuit 134.

The semiconductor chip 120 may be a radio frequency integrated circuit (RFIC) manufactured by a semiconductor manufacturing process, and may be manufactured based on a silicon substrate or the like, for example. The semiconductor chip 120 is provided on the heat sink 110. The semiconductor chip 120 has a lower surface making contact with the upper surface 110U of the heat sink 110, the circuit surface 120U, a circuit 120A provided inside the semiconductor chip 120, and terminals 121 and 122. The circuit surface 120U corresponds to the upper surface of the semiconductor chip 120, and the terminals 121 and 122 of the semiconductor chip 120 are provided on the circuit surface 120U. The terminals 121 are an example of first terminals, and the terminals 122 are an example of second terminals.

The circuit 120A may be a circuit for wireless communication, such as a power amplifier for transmission, a low-noise amplifier (LNA) or filter for reception, or the like. The circuit 120A is electrically connected to the terminals 121 and 122 via interconnects or the like (not illustrated).

The terminals 121 are electrically connected to the circuit 120A inside the semiconductor chip 120, as illustrated in FIG. 2. The terminals 121 are electrically connected to the interconnects A of the wiring board 130 outside the semiconductor chip 120, and the interconnects A are electrically connected to the terminals 52 of the RF board 50 via the BGA 150. For this reason, the circuit 120A is electrically connected to the terminals 52 of the RF board 50 via the interconnects A.

The terminals 122 are electrically connected to the circuit 120A inside the semiconductor chip 120. The terminals 122 are electrically connected to interconnects B of the wiring board 130 outside the semiconductor chip 120, and the interconnects B are electrically connected to a plurality of antennas 140 provided on an upper surface of the wiring board 130. For this reason, the circuit 120A is electrically connected to the plurality of antennas 140 via the interconnects B. The interconnects B may be power supply lines. The interconnects B are an example of a second interconnect.

The wiring board 130 includes the lower surface 130L, an upper surface 130U, insulating layers 131, interconnect layers 132, vias 133, and the matching circuit 134. The lower surface 130L is an example of a first board surface, and the upper surface 130U is an example of a second board surface. The wiring board 130 has a configuration in which a plurality of insulating layers 131 and a plurality of interconnect layers (the interconnect layers 132 and the matching circuit 134) are alternately laminated, and the plurality of interconnect layers (the interconnect layers 132 and the matching circuit 134) is electrically connected to each other through a plurality of vias 133. The wiring board 130 having such a configuration can be manufactured by a redistribution process of the manufacturing process, for example.

A planar size of the wiring board 130 in the plan view is larger than a planar size of each of the heat sink 110 and the semiconductor chip 120 in the plan view. Moreover, the wiring board 130 may be located at a height position in the Z-direction above a height position of each of the heat sink 110 and the semiconductor chip 120 in the Z-direction. The wiring board 130 covers the side surface of the heat sink 110 and a side surface of the semiconductor chip 120, and the circuit surface 120U of the semiconductor chip 120 located on an opposite side from the heat sink 110. In addition, the wiring board 130 exposes the lower surface 130L of the heat sink 110 at the lower surface 110L thereof.

Among the plurality of insulating layers 131, one insulating layer 131 located at a height position identical to a height position of the semiconductor chip 120 is distinguishably illustrated as an insulating layer 131A in FIG. 2. In other words, a lower surface of the insulating layer 131A may coincide with the lower surface of the semiconductor chip 120. The insulating layer 131A, that is one of the plurality of insulating layers 131 included in the wiring board 130, has the largest thickness (that is, is the thickest) among the plurality of insulating layers 131. As an example, the insulating layers 131, other than the insulating layer 131A, have a configuration that uses a resin film material, such as a film material (for example, an ABF (Ajinomoto Build-Up Film, registered trademark) material manufactured by Ajinomoto Finetechno Co., Ltd.) in which a filler, such as alumina or the like, is mixed into an epoxy resin, a polyimide film, or the like. The insulating layer 131A can be formed of a molding agent in which a filler, such as alumina or the like, is mixed into an epoxy resin or the like. However, similar to the insulating layers 131 other than the insulating layer 131A, the insulating layer 131A may have a configuration that uses a resin film material, such as a film material in which a filler, such as alumina or the like, is mixed into an epoxy resin, a polyimide film, or the like.

The interconnect layers 132 are formed of copper (copper foil patterns), for example. Among all of the plurality of interconnect layers provided on the wiring board 130, the interconnect layers 132 are mainly provided above the upper surface of the semiconductor chip 120.

The vias 133 are formed of copper, for example. The vias 133 electrically connect the plurality of interconnect layers 132 to each other, and electrically connect the interconnect layers 132 to the matching circuit 134. The vias 133 may be through vias having a small diameter.

The matching circuit 134 is formed by one or more interconnect layers 132 located at the lowest position among all of the plurality of interconnect layers 132 provided in the wiring board 130, and the vias 133. The matching circuit 134 is formed of copper, for example. The matching circuit 134 is provided to achieve impedance matching between the BGAs 150, and the interconnect layers 132 and the vias 133. The matching circuit 134 includes capacitance components and inductance components that are formed by copper foil patterns, for example.

In the wiring board 130 having the configuration described above, the interconnects A illustrated in FIG. 2 are formed by parts of the insulating layers 131, the interconnect layers 132, the vias 133, and the matching circuit 134. The interconnects A electrically connect the terminals 121 of the semiconductor chip 120 to the BGA 150 that is electrically connected to the terminals 52 of the RF board 50. In addition, the interconnects B illustrated in FIG. 2 are formed by parts of the insulating layers 131, the interconnect layers 132, and the vias 133. The interconnects B electrically connect the terminals 122 of the semiconductor chip 120 to the plurality of antennas 140.

The plurality of antennas 140 may be a plurality of patch antennas provided on the upper surface 130U of the wiring board 130. The antennas 140 can be formed as copper foil patterns during the redistribution process of the manufacturing process, and may be formed of copper, for example, similar to the interconnect layers 132 and the vias 133. As an example, a configuration in which the semiconductor device 100 includes four antennas 140 will be described, but the semiconductor device 100 may include at least two antennas 140.

The radio waves radiated from the four antennas 140 form a single beam by beam forming, and an angle of the beam can be varied by controlling phases of the radio waves radiated from the four antennas 140 by the circuit 120A.

As illustrated in FIG. 1, FIG. 2, and FIG. 4, the BGAs 150 are provided on the lower surface 110L of the heat sink 110 and the lower surface 130L of the wiring board 130 (that is, the lower surface of the lowermost interconnect layer). The BGA 150 provided on the lower surface 110L, and the BGA 150 provided on the lower surface 130L, may be of identical types, for example. The BGAs of identical types refer to BGAs having the same size and formed of the same material, such that the BGAs can be used without distinguishing the BGAs from each other. A portion of the lower surface 110L of the heat sink 110 to which the BGA 150 is connected is an example of a board connecting part. In addition, terminals to which the BGA 150 is connected may be provided on the lower surface 110L of the heat sink 110. In this case, the terminals provided on the lower surface 110L is an example of the board connecting part.

As illustrated in FIG. 4, the BGA 150 located at a position overlapping the heat sink 110 in the plan view, is provided between the lower surface 110L of the heat sink 110 and the upper surface of the heat sink 51 of the RF board 50, as illustrated in FIG. 1 and FIG. 2. For this reason, the BGA 150 is directly connected to the heat sink 110, and the BGA 150 is also directly connected to the heat sink 51. Heat of the heat sink 110 is transferred to the heat sink 51 through the BGA 150, and dissipated from the heat sink 51 into the air. In addition, a portion of the heat is dissipated into the air from the heat sink 110 and the BGA 150.

As described above, because the heat sink 110 exposed at the lower surface of the semiconductor device 100 is connected to the heat sink 51 of the RF board 50 through the shortest path that is formed by the BGA 150 connected to the lower surface 110L, the heat sink 110 is connected to the heat sink 51 with a small thermal resistance. For this reason, the heat of the heat sink 110 can be efficiently dissipated outside the semiconductor device 100.

The semiconductor device 100 having the configuration described above can be manufactured as follows. FIG. 5A and FIG. 5B are diagrams for explaining manufacturing processes of the semiconductor device 100.

When manufacturing the semiconductor device 100, the insulating layer 131A having the height position identical to the height position of the semiconductor chip 120, the plurality of insulating layers 131 located above the insulating layer 131A, the plurality of interconnect layers 132, the plurality of vias 133, and the antennas 140 illustrated in FIG. 5A are formed by the redistribution process of the manufacturing process, such as a build-up process of the manufacturing process, for example. When forming the insulating layer 131A from a molding agent, the insulating layer 131A having the height position identical to the height position of the semiconductor chip 120 may be formed using a mold, a die, or the like. The plurality of insulating layers 131, the plurality of interconnect layers 132, the plurality of vias 133, and the antennas 140 can be formed on the semiconductor chip 120 and the insulating layer 131A.

Next, as illustrated in FIG. 5B, the plurality of insulating layers 131 and the matching circuit 134 can be formed under the semiconductor chip 120 and the insulating layer 131A, by the redistribution process of the manufacturing process. During this redistribution process, the matching circuit 134 can be formed by the interconnect layers and the vias. In addition, the heat sink 110 can be formed by a process identical to the process of forming the interconnect layers and the vias of the matching circuit 134, and thus, the heat sink 110 can be manufactured with ease. The manufacturing processes illustrated in FIG. 5A and FIG. 5B may actually be performed in a state where the structure is oriented upside down.

<Comparative Example of Semiconductor Device with Antenna>

Next, a semiconductor device 10 with an antenna according to a comparative example will be described with reference to FIG. 6. FIG. 6 is a diagram illustrating an example of a configuration of the semiconductor device 10 according to the comparative example. The semiconductor device 10 according to the comparative example illustrated in FIG. 6 has a configuration illustrated for comparison purposes, and is not a known device. That is, the semiconductor device 10 is not prior art.

The semiconductor device 10 according to the comparative example is mounted on the RF board 50, similar to the semiconductor device 100 according to the embodiment. The semiconductor device 10 according to the comparative example includes a heat sink 11, a semiconductor chip 12, a package 13, antennas 140, and a BGA 150.

The heat sink 11 includes a heat conducting layer 11A, and heat conducting vias 11B. The semiconductor chip 12 is similar to the semiconductor chip 120 of the embodiment, but the circuit surface is provided at a lower surface of the semiconductor chip 12. The package 13 includes an insulating layer 13A, a mold resin portion 13B, an insulating layer 13C, and a resin layer 13D.

Terminals on the lower surface of the semiconductor chip 12 are electrically connected to the BGA 150 through interconnects and vias provided in the insulating layer 13A, and are also electrically connected to the antennas 140. A side surface of the semiconductor chip 12 is covered with the mold resin portion 13B. The heat conducting layer 11A provided in the insulating layer 13C is connected to an upper surface of the semiconductor chip 12. The heat conducting layer 11A is connected to the heat conducting vias 11B penetrating the mold resin portion 13B in the up-down direction, and lower ends of the heat conducting vias 11B are connected to the heat sink 51 of the RF board 50, through the interconnects and the vias provided in the insulating layer 13A, and the BGA 150.

Because the semiconductor device 10 according to the comparative example is configured to dissipate the heat from the upper surface of the semiconductor chip 12 to the heat sink 51 through the heat sink 11 (that is, the heat conducting layer 11A and the heat conducting vias 11B), the heat dissipation path is narrow and long, thereby making the thermal resistance large. For this reason, the semiconductor device 10 according to the comparative example cannot ensure a sufficient heat dissipation, and the configuration thereof is unsuited for mounting a high-output RFIC chip. In addition, because the antennas 140 are electrically connected to the terminals on the lower surface of the semiconductor chip 12, the interconnects (not illustrated) between the antennas 140 and the terminals on the lower surface of the semiconductor chip 12 are long, thereby making the semiconductor device 10 unsuited for the communication in the millimeter band or extremely high frequency.

On the other hand, in the semiconductor device 100 according to the embodiment illustrated in FIG. 1, the lower surface of the semiconductor chip 120 is connected to the heat sink 51 of the RF board 50 via the BGA 150, and the BGA 150 forms a sufficiently wide and short heat dissipation path. For this reason, the semiconductor device 100 according to the embodiment can efficiently transfer the heat dissipated from the semiconductor chip 120 to the heat sink 51 of the RF board 50, and the configuration of the semiconductor device 100 is suited for mounting the high-output RFIC chip. That is, in the semiconductor device 100 according to the embodiment, the heat dissipation of the semiconductor chip 120 is extremely high compared to that of the semiconductor chip 12 of the semiconductor device 10 according to the comparative example. In addition, because the distance between the semiconductor chip 120 and the antennas 140 is short, the semiconductor device 100 according to the embodiment is suited for the communication in the millimeter band or extremely high frequency.

In the semiconductor device 100 according to the embodiment, the side surfaces of the heat sink 110 and the semiconductor chip 120, and the upper surface (or circuit surface) of the semiconductor chip 120 are covered with the wiring board 130 in which the resin insulating layers 131 and the metal interconnect layers 132 are laminated. Further, the lower surface 130L of the heat sink 110 is exposed at the lower surface 110L of the wiring board 130. The lower surface of the lowermost interconnect layer of the wiring board 130 at the lower surface 130L, and the terminals 122 provided on the circuit surface 120U of the semiconductor chip 120, are electrically connected by the interconnects A. The antennas 140, and the terminals 121 provided on the circuit surface 120U of the semiconductor chip 120, are electrically connected by the interconnects B. For this reason, the size of the semiconductor device 100 according to the embodiment can be reduced, by using the wiring board 130 in which the resin insulating layers 131 and the metal interconnect layers 132 are laminated.

<Advantageous Features>

Accordingly, it is possible to provide the semiconductor device 100 with the antennas 140, that can be reduced in size.

Because the heat sink 110 can be formed by a process identical to the process of forming the interconnect layers and the vias of the matching circuit 134, the heat sink 110 can be manufactured with ease. In this case, compared to a case where a plate shaped block formed of copper is used as the heat sink, and the insulating layers and the interconnect layers are formed in the periphery of the heat sink by the redistribution process of the manufacturing process, or a case where a portion of the wiring board is removed and a plate shaped block is embedded as the heat sink, for example, it is possible to greatly reduce the number of manufacturing processes, and manufacture the entire semiconductor device 100 with ease.

In addition, because the distance between the semiconductor chip 120 and the antennas 140 is short, the distance between the semiconductor chip 120 and the antennas 140 can be shortened when performing the communication using the radio waves in the millimeter band, particularly in a band higher than or equal to 40 GHz and expected for use in the 6G mobile communication system. Hence, radio waves with low loss and high output or power can be radiated from the antennas 140.

The plurality of BGAs 150 of the identical types is further included, and the plurality of BGAs 150 is provided on the board connecting part at the lower surface 130L of the wiring board 130, and on the lower surface 110L of the heat sink 110. Because the plurality of BGAs 150 of the identical types can be provided on the board connecting part at the lower surface 130L of the wiring board 130, and on the lower surface 110L of the heat sink 110, it is possible to provide the semiconductor device 100 with the antennas 140, that can be made small and manufactured with ease. In addition, by using the plurality of BGAs 150 of the identical types, it is possible to increase the degree of freedom in routing the interconnects and the vias in the wiring board 130, thereby making it possible to flexibly cope with various circuit designs.

Because the plurality of BGAs 150 of the identical types is provided on the board connecting part at the lower surface 130L of the wiring board 130, and on the lower surface 110L of the heat sink 110, it is easy to manage the manufacturing process in that the height position of the lower surface 130L of the wiring board 130 and the height position of the lower surface 110L of the heat sink 110 are simply required to be aligned to become the same. Further, by providing the plurality of BGAs 150 of the identical types, it is possible to reduce the manufacturing cost. Because the connection between the lower surface of the lowermost interconnect layer at the lower surface 130L of the wiring board 130 and the terminals 52 of the RF board 50, and the connection between the lower surface 110L of the heat sink 110 and the upper surface of the heat sink 51 of the RF board 50 can be made by the BGAs 150 of the identical types, the semiconductor device 100 can easily be mounted on the RF board 50.

In addition, because the wiring board 130 130 can be formed by redistribution layers, it is possible to reduce the size of the semiconductor device 100, and to easily form the interconnects A from the terminals 121 on the circuit surface at the upper surface of the semiconductor chip 120, to the lower surface 130L of the wiring board 130.

First Modification

Figure 7:
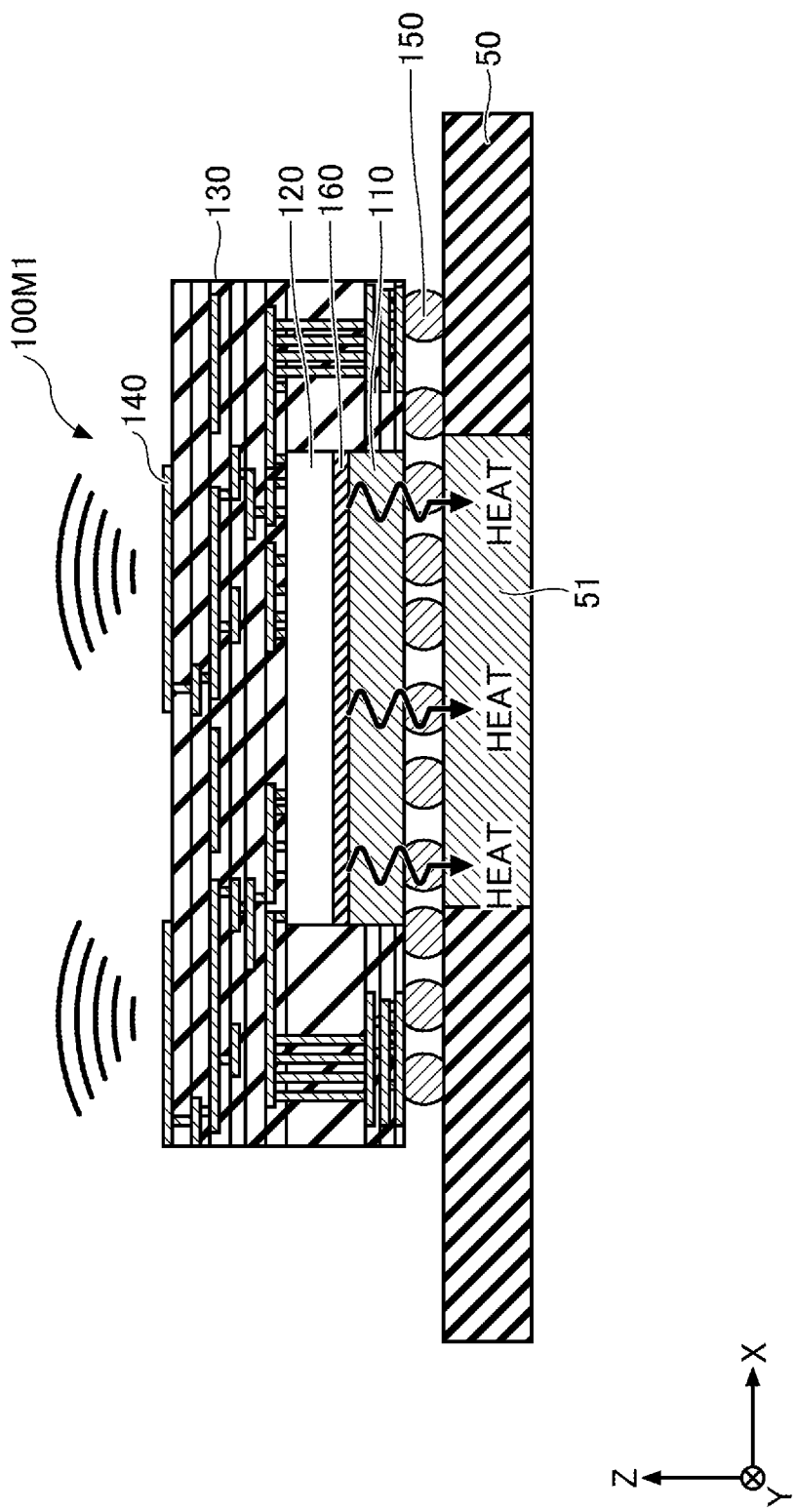
FIG. 7 is a diagram illustrating an example of the configuration of the semiconductor device with the antenna according to a first modification of the embodiment.

FIG. 7 is a diagram illustrating an example of the configuration of a semiconductor device 100M1 with the antenna according to a first modification of the embodiment. The semiconductor device 100M1 further includes a heat conducting member 160 provided between the heat sink 110 and the semiconductor chip 120. A hardness of the heat conducting member 160 is lower than hardnesses of the heat sink 110 and the semiconductor chip 120. The heat conducting member 160 is provided to reduce breaking caused by a stress between the semiconductor chip 120 and the heat sink 110, due to a difference between linear expansion coefficients of the semiconductor chip 120 and the heat sink 110, a stress applied during the manufacturing process, or the like. According to the semiconductor device 100M1 according to the first modification, it is possible to improve a resistance with respect to the stress or the like on the entire semiconductor device 100M1.

For example, a thermal interface material (TIM) can be used for the heat conducting member 160. Examples of the TIM include a silicone type heat conducting sheet manufactured by Dexerials Corporation, a thermosetting TIM commercially available from Cosmo Oil Co., Ltd., or the like. The material used for the heat conducting member 160 is not specifically limited, as long as the hardness of the material used for the heat conducting member 160 is lower than the hardnesses of the heat sink 110 and the semiconductor chip 120.

By providing the heat conducting member 160 having the hardness lower than the hardnesses of the heat sink 110 and the semiconductor chip 120, it is possible to reduce breaking at an interface between the heat sink 110 and the semiconductor chip 120, even when the semiconductor chip 120 generates heat and reaches a high temperature. For this reason, in a case where the breaking at the interface between the heat sink 110 and the semiconductor chip 120 requires to be reduced depending on an application, the heat conducting member 160 may be provided. When manufacturing the semiconductor device 100M1, the heat conducting member 160 may be attached to the lower surface of the semiconductor chip 120 after the manufacturing process illustrated in FIG. 5A, and the heat sink 110 may thereafter be formed on the lower surface of the heat conducting member 160.

Second Modification

Figure 8:
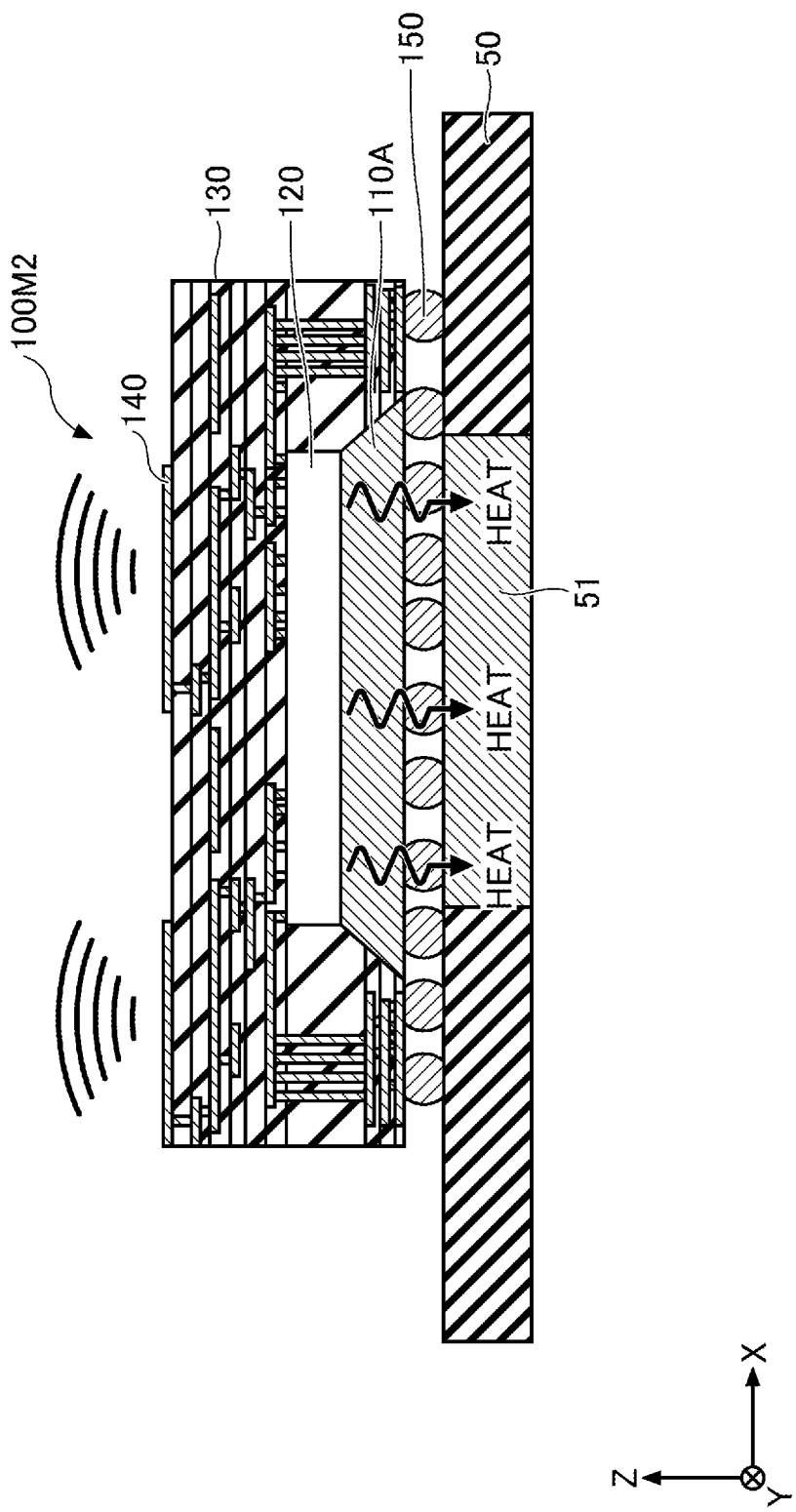
FIG. 8 is a diagram illustrating an example of the configuration of the semiconductor device with the antenna according to a second modification of the embodiment.

FIG. 8 is a diagram illustrating an example of the configuration of a semiconductor device 100M2 with the antenna according to a second modification of the embodiment. The antenna device 100M2 has a configuration in which the heat sink 110 illustrated in FIG. 1 is replaced with a heat sink 110A.

A size of an upper surface of the heat sink 110A is the same as the planar size of the semiconductor chip 120, and the heat sink 110A has a tapered shape that spreads toward a lower surface of the heat sink 110A. That is, the heat sink 110A has a truncated pyramid shape that spreads downward. Because the upper surface of the heat sink 110A is aligned to coincide with the lower surface of the semiconductor chip 120, an outer edge of the lower surface of the heat sink 110A includes and encloses the semiconductor chip 120 in the plan view.

That is, the upper surface of the heat sink 110A overlaps an entirety of the semiconductor chip 120 in the plan view, and the size of the upper surface of the heat sink 110A is equal to the size of the semiconductor chip 120 in the plan view. In addition, the size of the lower surface of the heat sink 110A is larger than the size of the semiconductor chip 120 in the plan view.

For this reason, the heat sink 110A is connected to a larger number of balls of the BGA 150 than the heat sink 110, and it is possible to improve the heat dissipation. In the semiconductor device 100M2 according to the second modification of the embodiment, it is possible to reduce the thermal resistance from the semiconductor chip 120 to the heat sink 51 of the RF board 50 to ¼ to ⅕ of the thermal resistance of the semiconductor device 10 according to the comparative example. Because the package can withstand the high heat generation from the semiconductor chip 120, the output or power of the semiconductor chip 120 can be increased, and it is possible to provide the semiconductor device 100M2 having a higher performance for the base station, thereby making it possible to provide the base station with a higher performance.

Third Modification

Figure 9:
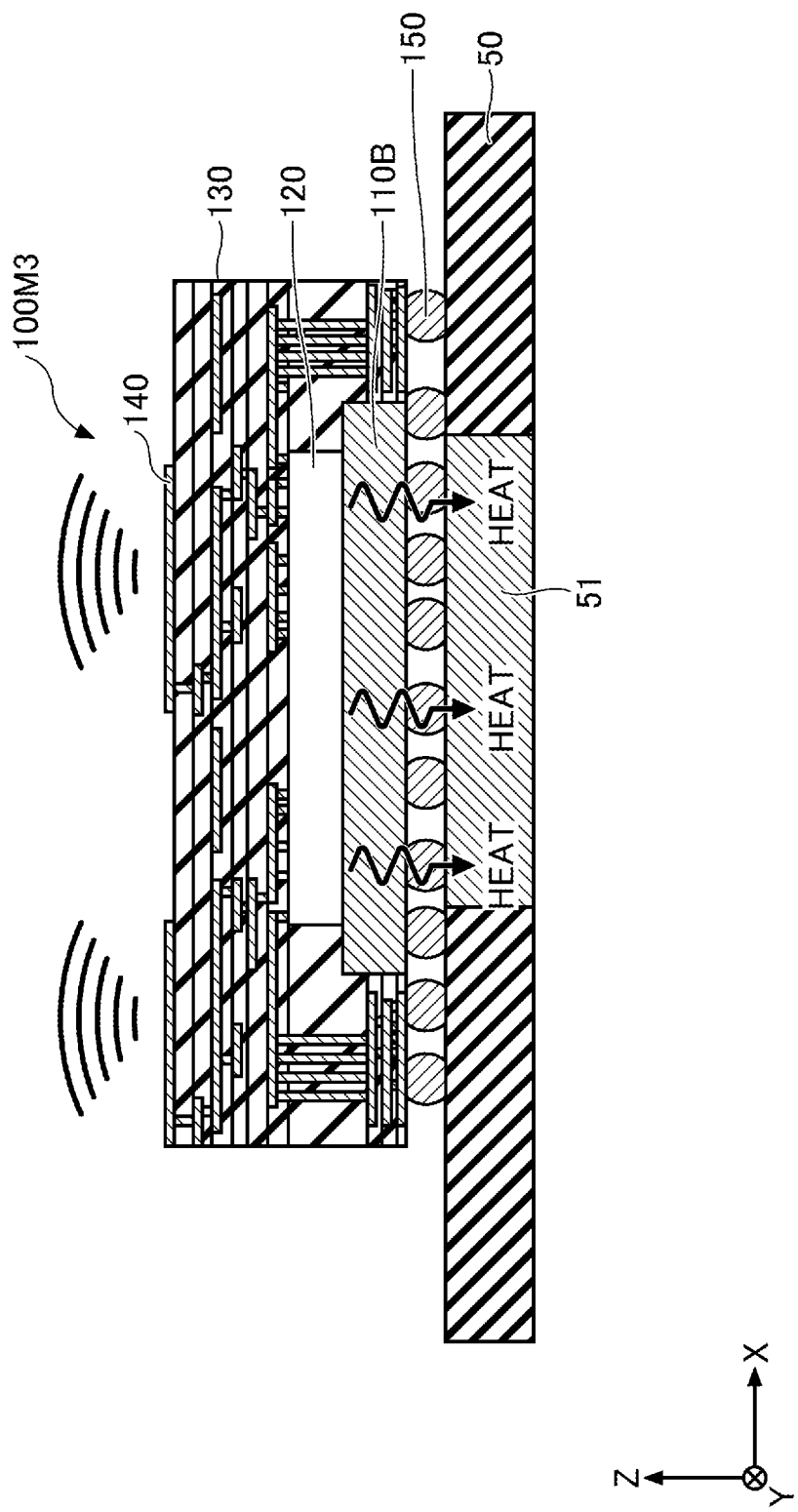
FIG. 9 is a diagram illustrating an example of the configuration of the semiconductor device with the antenna according to a third modification of the embodiment.

As illustrated in FIG. 9, the upper surface and the lower surface of the heat sink may have the same size. FIG. 9 is a diagram illustrating an example of the configuration of a semiconductor device 100M3 with the antenna according to a third modification of the embodiment. The semiconductor device 100M3 has a configuration in which the heat sink 110A illustrated in FIG. 8 is replaced with a heat sink 110B.

The upper surface and the lower surface of the heat sink 110B have the same size, and the heat sink 110B overlaps the entire semiconductor chip 120 in the plan view. That is, the upper surface of the heat sink 110B overlaps the entirety of the semiconductor chip 120 in the plan view, and the size of the upper surface of the heat sink 110B is larger than the size of the semiconductor chip 120 in the plan view. The size of the lower surface of the heat sink 110B is also larger than the size of the semiconductor chip 120 in the plan view.

For this reason, the heat sink 110B is connected to a larger number balls of the BGA 150 than the heat sink 110, and it is possible to improve the heat dissipation.

In the semiconductor devices 100M2 and 100M3 illustrated in FIG. 8 and FIG. 9, the upper surface of each of the heat sinks 110A and 110B overlaps the entirety of the semiconductor chip 120 in the plan view, and the size of the upper surface of each of the heat sinks 110A and 110B is equal to or larger than the size of the semiconductor chip 120 in the plan view.

According to the embodiments and the modifications described above, it is possible to provide a semiconductor device with an antenna, that can be reduced in size.

Although the modifications are numbered with, for example, "first," "second," or "third," the ordinal numbers do not imply priorities of the modifications. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device with an antenna, comprising:
   a heat sink having a first surface, and a second surface located on an opposite side from the first surface;
   a semiconductor chip provided on the second surface of the heat sink, and having a circuit surface located on an opposite side from a surface thereof directly opposing the second surface of the heat sink;
   a wiring board having a first board surface located at a position closer to the first surface than to the second surface of the heat sink, a second board surface located on an opposite side from the first board surface, and a laminate of alternately disposed insulating layers and interconnect layers,
   wherein the wiring board covers a side surface of the heat sink, and a side surface and the circuit surface of the semiconductor chip, and exposes the first surface of the heat sink at the first board surface; and
   an antenna provided on the second board surface of the wiring board,
   wherein the wiring board further includes
      a board connecting part provided on the first board surface,
      a first interconnect configured to electrically connect the board connecting part and a first terminal provided on the circuit surface of the semiconductor chip, and
      a second interconnect configured to electrically connect the antenna and a second terminal provided on the circuit surface of the semiconductor chip.

2. The semiconductor device with the antenna as claimed in claim 1, further comprising:
   a plurality of connection terminals of identical types,
   wherein the plurality of connection terminals is provided on the board connecting part of the first board surface, and on the first surface of the heat sink.

3. The semiconductor device with the antenna as claimed in claim 2, wherein the plurality of connection terminals includes a first ball grid array and a second ball grid array of identical types.

4. A combination comprising:
   the semiconductor device with the antenna as claimed in claim 3; and
   a radio frequency board including
      a second heat sink directly connected to the first ball grid array, and
      a third terminal electrically connected to the board connecting part via the second ball grid array,
   wherein the heat sink, the first ball grid array, and the second heat sink form a heat dissipation path for heat generated from the semiconductor chip.

5. The combination as claimed in claim 4, wherein the wiring board further includes a matching circuit formed by one or more interconnect layers of the interconnect layers, located at a position closest to the first board surface among all of the interconnect layers, and vias.

6. The semiconductor device with the antenna as claimed in claim 1, wherein
   the second surface of the heat sink overlaps an entirety of the semiconductor chip in a plan view,
   a size of the second surface is greater than or equal to a size of the semiconductor chip in the plan view, and a size of the first surface of the heat sink is greater than the size of the semiconductor chip in the plan view.

7. The semiconductor device with the antenna as claimed in claim 1, further comprising:
a heat conducting member provided between the semiconductor chip and the heat sink,
wherein the heat conducting member has a hardness lower than hardnesses of the heat sink and the semiconductor chip.

8. The semiconductor device with the antenna as claimed in claim 1, wherein the wiring board is formed by redistribution layers.

9. The semiconductor device with the antenna as claimed in claim 8, wherein
the insulating layers of the wiring board are formed of a resin, and
the interconnect layers of the wiring board are formed of a metal.

10. The semiconductor device with the antenna as claimed in claim 9, wherein the heat sink and one of the interconnect layers of the wiring board, located at identical height positions such that the second surface of the heat sink and a surface of the one of the interconnect layers coincide, are formed of identical metal materials.

11. The semiconductor device with the antenna as claimed in claim 1, wherein one insulating layer of the insulating layers of the wiring board, located at a height position identical to a height position of the semiconductor chip such that a surface of the one insulating layer and the first board surface of the wiring board coincide, has a largest thickness among the insulating layers.

12. The semiconductor device with the antenna as claimed in claim 1, wherein the antenna is provided on the second board surface of the wiring board at a plurality of locations in a plan view.

* * * * *